United States Patent [19]
Bashir

[11] Patent Number: 5,594,691
[45] Date of Patent: Jan. 14, 1997

[54] ADDRESS TRANSITION DETECTION SENSING INTERFACE FOR FLASH MEMORY HAVING MULTI-BIT CELLS

[75] Inventor: Amir Bashir, Folsom, Calif.

[73] Assignee: Intel Corporation, Santa Clara, Calif.

[21] Appl. No.: 389,043

[22] Filed: Feb. 15, 1995

[51] Int. Cl.$^6$ .................................................... G11C 13/00
[52] U.S. Cl. ................................ 365/189.09; 365/189.05; 365/189.07; 365/203; 365/207; 365/210; 365/233.5
[58] Field of Search .............................. 365/210, 189.09, 365/207, 189.05, 189.07, 203, 233.5, 230.08

[56] References Cited

U.S. PATENT DOCUMENTS

| | | | |
|---|---|---|---|
| 4,415,992 | 11/1983 | Adlhoch | 365/94 |
| 5,163,021 | 11/1992 | Mehrotra et al. | 365/185 |
| 5,243,575 | 9/1993 | Sambandan et al. | 365/233.5 |
| 5,260,901 | 11/1993 | Nagase et al. | 365/189.07 X |
| 5,283,761 | 2/1994 | Gillingham | 365/168 X |
| 5,289,412 | 2/1994 | Frary et al. | 365/185 |
| 5,305,273 | 4/1994 | Jinbo | 364/210 |
| 5,539,690 | 7/1996 | Talreja et al. | 365/185.22 |

*Primary Examiner*—Do Hyun Yoo
*Attorney, Agent, or Firm*—Blakely, Sokoloff, Taylor & Zafman

[57] ABSTRACT

An address transition detection interface is disclosed for a sensing circuit that determines a state of a memory cell having n possible states, where n is greater than 2, and wherein no decoding logic is required to translate outputs of comparators into binary bits. In the case where n is 4, the sensing circuit includes a first reference corresponding to a first threshold voltage level and a first comparator coupled to the memory cell and to the first reference. The first comparator compares a threshold voltage level of the memory cell to the first reference and provides a first result of the comparison as output. The sensing circuit further includes a second reference corresponding to a second threshold voltage level and a third reference corresponding to a third voltage level. A second comparator has one of its inputs coupled to the memory cell and its second input is selectively coupled to either the second reference or the third reference. A selector circuit selects between the second and third references in response to the first result. The selector circuit couples the second reference to the second comparator if the threshold voltage level of the memory cell is less than the first threshold voltage level. The selector circuit couples the third reference to the second comparator if the threshold voltage level of the memory cell is greater than the first voltage level. A forcing circuit provides the first reference to the second comparator in place of the second and third references for a predetermined period following the output of the first result by the first comparator and prior to the selective coupling to the second comparator by the selector circuit of the second reference or the third reference.

32 Claims, 10 Drawing Sheets

ADDRESS TRANSITION DETECTION SENSING INTERFACE FOR FLASH MEMORY HAVING MULTI-BIT CELLS

FIELD OF THE INVENTION

The present invention relates generally to determining the state of a semiconductor memory cell and specifically to sensing the state of a flash memory cell that stores more than a single bit of data.

BACKGROUND OF THE INVENTION

Nonvolatile semiconductor memory devices are fundamental building blocks in prior art computer system designs. The primary mechanism by which data is stored in nonvolatile memory is the memory cell. Typical prior memory technologies provide a maximum storage capacity of one bit, or two states, per cell. Semiconductor memory cells having more than two possible states are known in the prior art, and specific references are cited at the close of the Background of the Invention.

One type of prior nonvolatile semiconductor memory is the flash electrically-erasable programmable read-only memory ("flash EEPROM"). Prior art flash EEPROMs typically allow for the simultaneous reading of several flash cells. Further, typical prior flash EEPROMs have a storage capacity that is much greater than the amount of data that can be output at any one time. Accordingly, each output of a flash EEPROM is typically associated with an array of flash cells that is arranged into rows and columns, where each flash cell in an array is uniquely addressable. When a user provides an address, row and column decoding logic within the flash EEPROM selects the corresponding flash cell.

A typical prior flash memory cell is comprised of a single field effect transistor ("FET") including a select gate, a floating gate, a source, and a drain. Information is stored in the flash cell by altering the amount of charge on the floating gate, which causes the threshold voltage $V_t$ of the flash cell to be varied. The typical prior art flash memory cell is in one of two possible states, being either "programmed" or "erased" with the erased state and the programmed state each specify a range of $V_t$ voltages. The flash cell can theoretically possess a separate identifiable state for each electron that is added to the floating gate. Practically speaking, however, prior flash cells typically have only two possible states because of inconsistencies in flash cell structure, charge loss over time, thermal considerations and inaccuracies in sensing the charge on the floating gate that affect the ability to determine the data stored in the flash cell.

To distinguish between the two possible states, the states are separated by a separation range. According to one prior method, when a flash cell is read, the current conducted by the flash cell is compared to a current conducted by a reference flash cell having a threshold voltage $V_t$ set to a predetermined reference voltage that is a voltage within the separation range. A single comparator typically makes the comparison and outputs the result.

When a flash cell is selected for reading, a biasing voltage is applied to the select gate. Simultaneously, the same biasing voltage is applied to the select gate of the reference cell. If the flash cell is programmed, excess electrons are trapped on the floating gate, and the threshold voltage $V_t$ of flash cell is increased such that the selected flash cell conducts less drain current than the reference flash cell. The programmed state of the prior flash cell is typically indicated by a logic 0. If the prior flash cell is erased, little or no excess electrons are on the floating gate, and the flash cell conducts more drain-source current than the reference cell. The erased state of the prior flash cell is typically indicated by a logic 1.

When a flash cell has three or more possible states, the prior art sensing schemes and circuits similar to that described above are inadequate. First, as a general rule, there must be at least (n–1) references for n states. This can be implemented as (n–1) reference cells. Thus, for three states, there must be two references. Typical prior art sensing schemes discriminate between two states and provide only one voltage reference. Second, the use of a single comparator in typical prior sensing schemes, without more, is not adequate to retrieve data from a multi-level flash cell.

U.S. Pat. No. 4,415,992 describes a sensing scheme for sensing the state of a memory cell capable of storing n states in which (n–1) comparators and (n–1) voltage references are used in parallel to determine the state of the memory cell. Each comparator compares a corresponding one of the (n–1) voltage references to a voltage determined by the drain-source current of the memory cell. Decoding logic is required to translate the outputs of the (n–1) comparators into ($\log_2 n$) binary bits.

U.S. Pat. No. 5,163,021 describes a sensing scheme in which n comparators are sequentially used to compare the state of a memory cell capable of storing n states to a corresponding n references. Again, decoding logic is required to translate the outputs of the (n–1) comparators into ($\log_2 n$) binary bits.

Co-pending patent application Ser. No. 08/252,680, Bauer, et al., filed Jun. 2, 1994, entitled "Sensing Scheme for Flash Memory with Multilevel Cells" describes a sensing circuit for determining a state of a memory cell having n possible states, where n is greater than 2, and wherein no decoding logic is required to translate outputs of comparators into binary bits. In the case where n is 4, the sensing circuit includes a first reference corresponding to a first threshold voltage level and a first comparator coupled to the memory cell and to the first reference. The first comparator compares a threshold voltage level of the memory cell to the first reference and provides a first result of the comparison as output. The sensing circuit further includes a second reference corresponding to a second threshold voltage level and a third reference corresponding to a third voltage level. A second comparator has one of its inputs coupled to the memory cell and its second input is selectively coupled to either the second reference or the third reference. A selector circuit selects between the second and third references in response to the first result. The selector circuit couples the second reference to the second comparator if the threshold voltage level of the memory cell is less than the first threshold voltage level. The selector circuit couples the third reference to the second comparator if the threshold voltage level of the memory cell is greater than the first voltage level.

Address transition detection ("ATD") is also well known in the art and has been widely used in binary cell memory array devices such as static random access memory (SRAM) and erasable programmable read-only memory (EPROM). The purpose of address transition detection circuitry is to increase the speed with which data can be read from memory. This is accomplished by performing operations that are required for every memory read operation as soon as an address transition has been detected.

These operations include equalizing sense amplifiers and latching previous output data. The sense amplifiers are used to increase weak signals sensed from the memory cells to be read during the read operation. Equalizing the sense amplifiers causes the amplifiers to be cleared or otherwise set up so that they are ready to process the new data to be read. Latching the previous output data causes the output data to remain static until the new data from the read operation has been output from the sense amplifiers. The previous output is latched because the output of the sense amplifiers fluctuates before it finally reaches a steady value. Latching the previous output ensures that the swing does not pass down to the outputs. Latching the output also provides a power savings because, so long as the address being read does not change, the output can be provided from the latches once the address specified has been read and its contents latched. Thus, the majority of the memory array can be powered down until the next address transition is detected.

Circuitry to equalize the sense amplifiers and latch previous output is well known in the art. In fact, both operations are normally performed during a binary cell memory read operation. ATD has not been used, however, with flash memory having multi-level cells. Therefore, it is desirable to have a method and circuitry to exploit address transition detection within a multi-level cell device, and thereby, to increase read access speed and reliability when determining the state of a memory cell having more than two possible states.

SUMMARY AND OBJECTS OF THE INVENTION

A method and sensing circuitry for determining a state of a memory cell. A first sense amp is used to compare a cell charge level of the memory cell to a first reference and output a first result. In response to the first result, reference selection circuitry is used for selecting between second and third references. Following output of the first result, forcing circuitry is used for a predetermined period of time to provide the first reference to a second sense amp in place of the selected one of the second and third references. The second sense amp is used for comparing the cell charge level of the memory cell to the selected one of the second and third references and outputting a second result.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
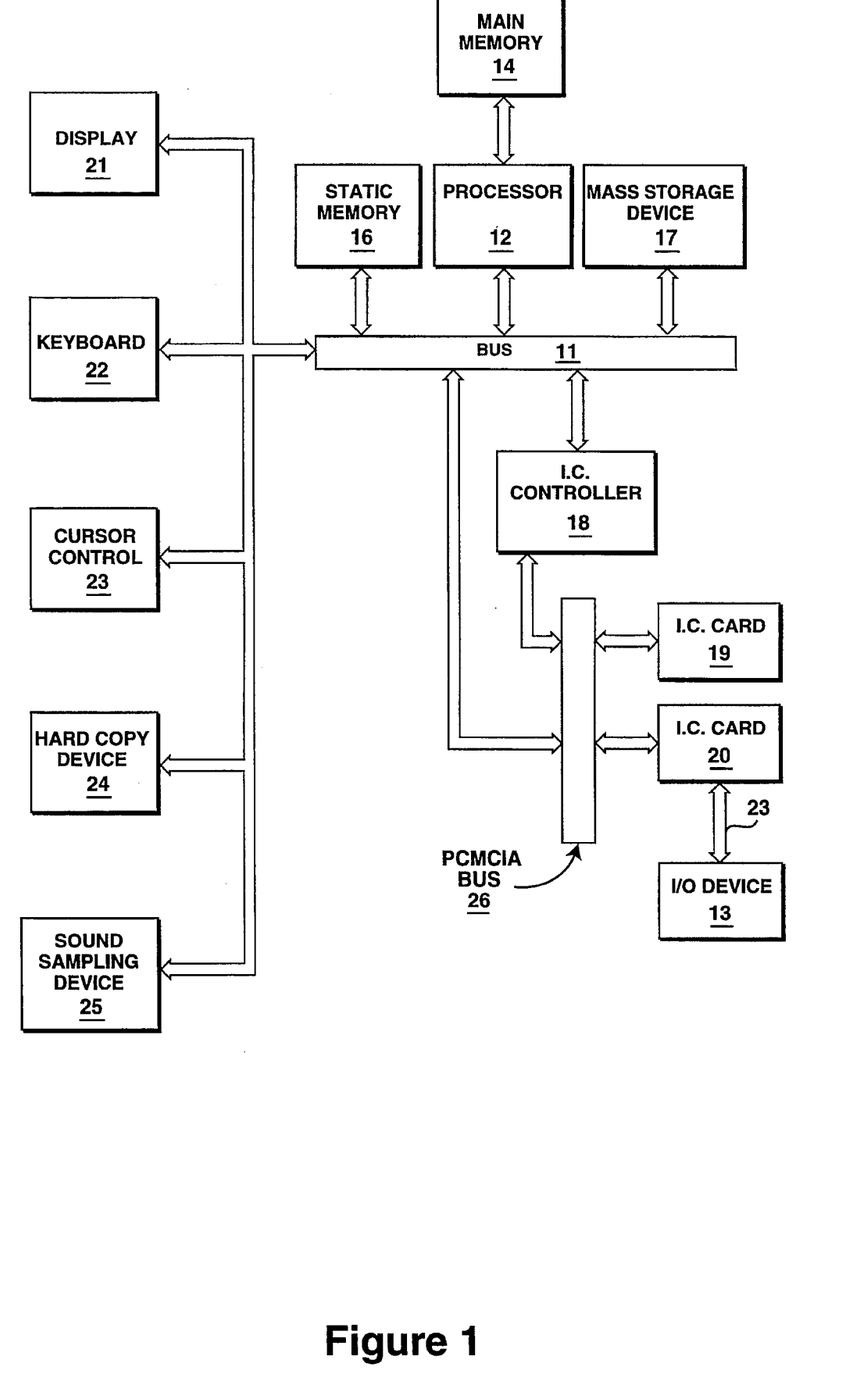
FIG. 1 is a block diagram of a computer system according to one embodiment wherein address transition detection is used when reading data from a memory cell having more than two possible states.

FIG. 1 is a block diagram of a computer system according to one embodiment wherein address transition detection is used when reading data from a memory cell having more than two possible states. The computer system generally includes a bus 11, to which may be coupled a processor 12, main memory 14, static memory 16, mass storage device 17, and integrated circuit controller 18. Static memory 16 may include a flash electrically erasable programmable read-only memory ("flash EEPROM") or other nonvolatile memory device that stores multiple bits of data per cell. Similarly, mass storage device 17 may be a solid state hard drive 17 using multiple bit per cell nonvolatile memory devices for storing data.

Integrated circuit cards 19 and 20 may be included in the computer system and are coupled to a Personal Computer Memory Card Industry Association (PCMCIA) bus 26. PCMCIA bus 26 is coupled to bus 11 and to integrated circuit (IC) controller 18 for providing communication information between cards 19 and 20 and the remainder of the computer system. IC controller 18 provides control and address information to IC cards 19 and 20 via PCMCIA bus 26 and is coupled to bus 11.

The computer system may further include a display device 21, a keyboard 22, a cursor control device 23, a hard copy device, and a sound sampling device 25. The specific components and configuration of the computer system is determined by the particular applications for which the computer system is to be used. For example, the computer system of FIG. 1 may be a personal digital assistant (PDA), a pen-based computer system, a mainframe computer, or a personal computer.

Figure 2:
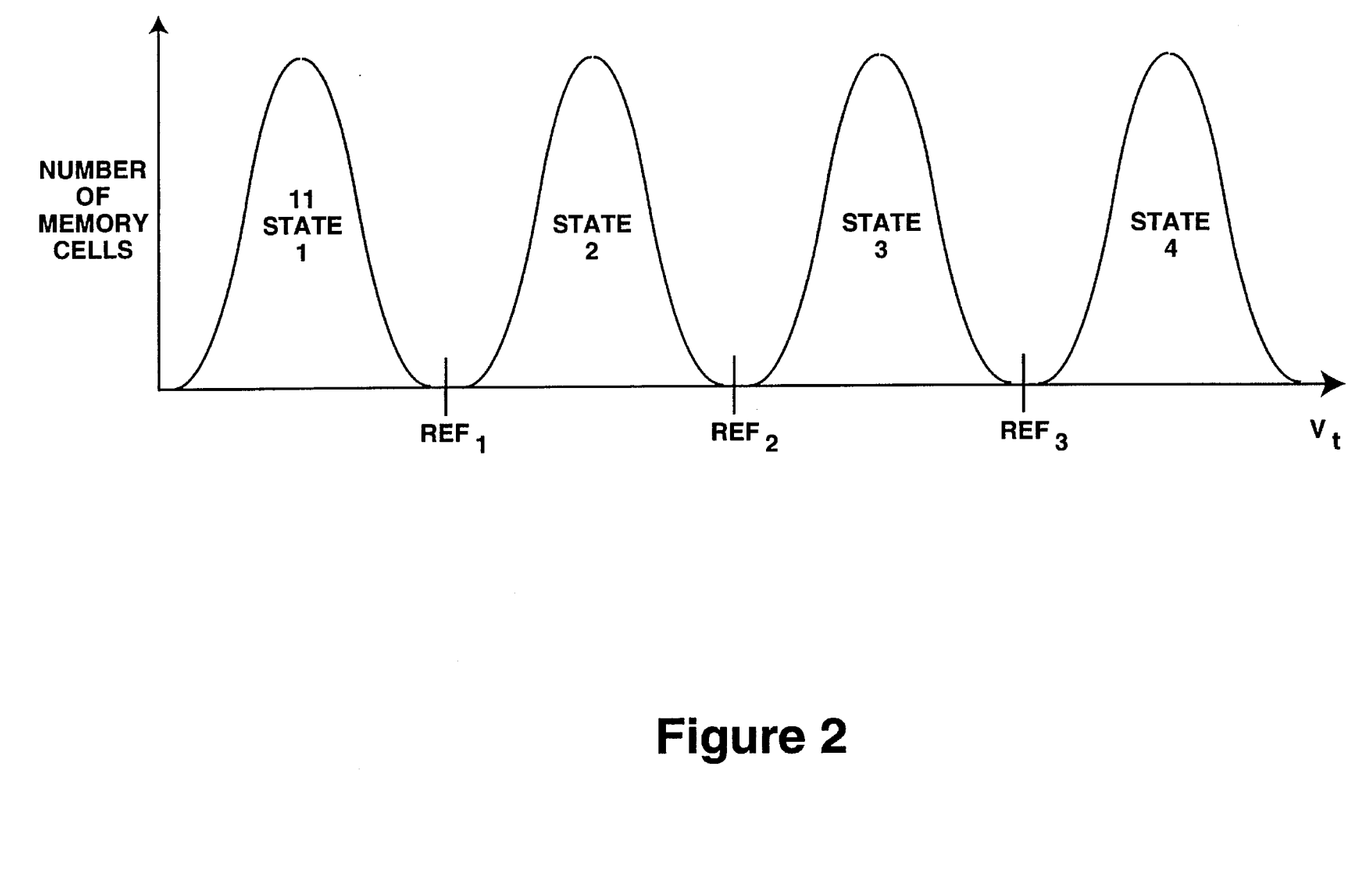
FIG. 2 illustrates a distribution of multi-level flash cells as a function of $V_T$ wherein each flash cell has four possible states.

For each embodiment, each memory cell is a flash cell. Each flash cell in the array is capable of being in one of four analog states, and the state of the flash cell is indicated by two binary bits. FIG. 2 shows a distribution of multi-level flash cells as a function of threshold voltage $V_t$. As can be seen, each state is separated by a separation range, and three references, $Ref_1$, $Ref_2$ and $Ref_3$, are provided, one each from the three separation ranges. The references are provided to distinguish between the analog states. State 1 encompasses the lowest range of $V_t$ voltages of the four states and is indicated by both bits being logic 1 (both erased). State 2 is indicated when the high order bit (Bit 1) is a logic 1 and the lower order bit (Bit 0) is a logic 0. State 3 is indicated by Bit 1 being a logic 0 and Bit 0 being a logic 1. State 4 is indicated by both bits being logic 0 (both programmed). The number n of possible states is not limited to four. For example, the number of states can be three, five, sixteen, etc. Further, the mapping of binary bits to analog states may be varied. For example, the lowest range of $V_t$ voltages can be indicated by both bits being logic 0.

It should be noted that nonvolatile memory devices other than flash EEPROMs and volatile memory devices such as Dynamic Random Access Memories (DRAM) are capable of storing three or more analog states. Further, it should be noted that the analog states of nonvolatile devices having a floating gate may be expressed in terms other than the threshold voltage $V_t$. For example, analog states may be expressed as ranges of threshold voltages $V_t$ as shown in FIG. 2, as ranges of drain currents $I_D$, or as ranges of charge stored on the floating gate. Volatile memory cells such as DRAM memory cells are typically comprised of a capacitor and may similarly be expressed as ranges of charge, currents or voltages.

A nonvolatile memory cell that has a floating gate behaves as a field effect transistor having a threshold voltage $V_t$ that increases as charge is added to the floating gate. The memory cell drain current $I_D$ ("cell current") decreases as the threshold voltage Vt and cell charge level increase. The memory cell threshold voltage $V_t$ is related to the memory cell drain current $I_D$ by the expression:

$$I_D \alpha\ G_m \times (V_G - V_t) \text{ for } V_D > V_G - V_t$$

$G_m$ is the transconductance of the memory cell;

$V_G$ is the memory cell gate voltage;

$V_D$ is the memory cell drain voltage; and $V_t$ is the memory cell threshold voltage.

Given this relationship, there are a number of different ways to sense the amount of charge stored on the floating gate of the memory cell, including: sensing the cell current of a memory cell when a constant voltage is applied to the select gate of the memory cell; sensing the amount of voltage required at the select gate to give rise to an expected cell current for the memory cell; sensing a voltage drop across a load that is coupled to the drain of the memory cell when a constant voltage is applied to the select gate of the memory cell, wherein the cell current determines the amount of the voltage drop across the load; and sensing the amount of voltage required at the select gate to give rise to an expected voltage drop across a load that is coupled to the drain of the memory cell. To determine the analog state of the memory cell, however, it is not necessary to quantify the precise amount of charge stored on the floating gate. It is sufficient to compare a characteristic of the memory cell to a known reference.

One type of reference is a reference memory cell programmed to have a known threshold voltage $V_t$ that is typically between defined states. Sensing circuitry for the memory cell may be replicated for the reference memory cell and the outputs of the sensing circuitry and reference sensing circuitry may be compared using a differential comparator. Because sensing the cell charge level of a memory cell typically requires the comparison of either voltages or currents, the reference may be provided by using voltage supplies or current sources to supply voltages or currents that correspond to reference memory cells having a cell charge level between defined analog states. For this reason, the references $Ref_1$, $Ref_2$, and $Ref_3$ are not specified as being threshold voltages, cell currents, or levels of charge stored on a floating gate. Instead, it is to be understood that the references shown in FIG. 2 correspond to the characteristics of the memory cell as defined by the relationship between cell charge level, cell current $I_D$, and threshold voltage $V_t$. For the purposes of simplifying the remaining discussion, the references $Ref_1$, $Ref_2$, and $Ref_3$ will expressed as threshold voltages $V_{R1}$, $V_{R2}$ and $V_{R3}$, respectively.

A binary search method can be used to determine the state of a memory cell having more than two possible states. In a first step for a four state memory cell such as that of FIG. 2, the cell charge level of the selected cell is sensed and compared to a first reference flash cell having its $V_t$ equal to $V_{R2}$. Depending on the result of the initial comparison, the sensed cell charge level of the selected cell is compared to a selected one of a second reference flash cell having its $V_t$ equal to $V_{R1}$ and a third reference flash cell having its $V_t$ equal to $V_{R3}$. If the sensed cell charge level of the selected flash is less than that of the first reference flash cell, the sensed cell charge level is compared to the second reference flash cell at step 2, and the selected flash cell is either in state 1 or state 2. If the sensed cell charge level of the selected flash is greater than that of the first reference flash cell, the sensed cell charge level is compared to the third reference flash cell at step 303, and the selected flash cell is either in state 3 or state 4. Sensing of the cell charge level may be performed according to any of the methods previously discussed.

Figure 3:
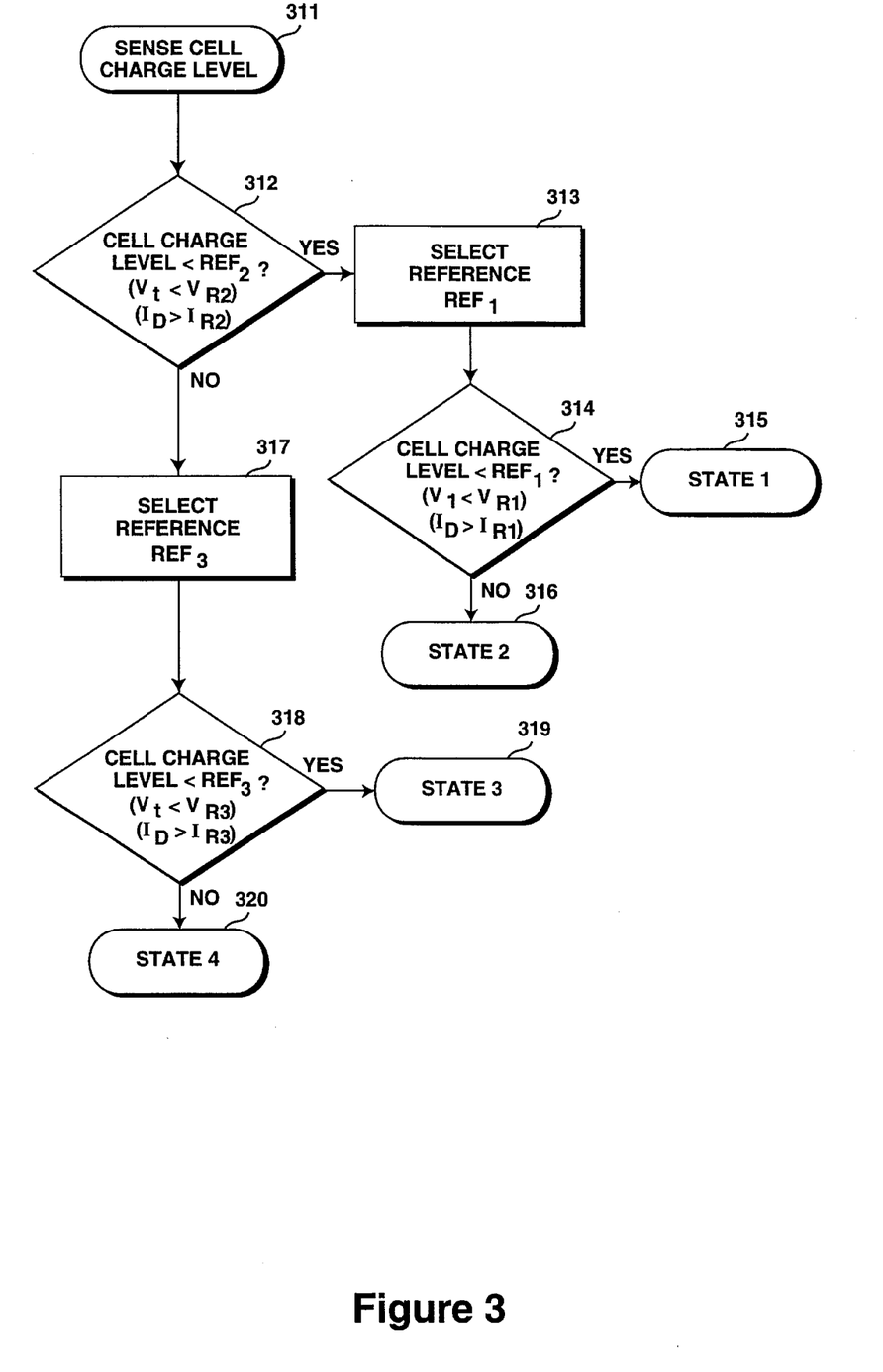
FIG. 3 illustrates a flow chart of a binary search using three reference cells when reading a flash cell having four possible states.

FIG. 3 is a flow chart showing the binary search method for a four state cell embodiment. At step 311, the cell charge level of the memory cell is sensed. At step 312, it is determined whether the cell charge of the memory cell is less than the cell charge level of the reference $Ref_2$. If the cell charge level of the memory cell is less than the cell charge level of the reference $Ref_2$, the threshold voltage $V_t$ of the memory cell is less than that of a reference memory cell having a $V_t$ equal to $V_{R2}$. Similarly, the cell current $I_D$ of the memory cell is greater than the cell current $I_{R2}$ of a reference memory cell having a cell current of $I_{R2}$. If the cell charge level of the memory cell is less than the cell charge level of reference $Ref_2$, $Ref_1$ is selected at step 313. At step 314, it is determined whether the cell charge of the memory cell is less than the cell charge level of the reference $Ref_1$. If the cell charge level of the memory cell is less than the cell charge level of the reference $Ref_1$, the memory cell is indicated as being in state 1 at step 315. If the cell charge level of the memory cell is greater than the cell charge level of the reference $Ref_1$, the memory cell is indicated as being in state 2 at step 316.

If the cell charge level of the memory cell is less than the cell charge level of reference $Ref_2$, $Ref_3$ is selected at step 317. At step 318, it is determined whether the cell charge of the memory cell is less than the cell charge level of the reference $Ref_3$. If the cell charge level of the memory cell is less than the cell charge level of the reference $Ref_3$, the memory cell is indicated as being in state 3 at step 319. If the cell charge level of the memory cell is greater than the cell charge level of the reference $Ref_3$, the memory cell is indicated as being in state 4 at step 320.

Figure 4:
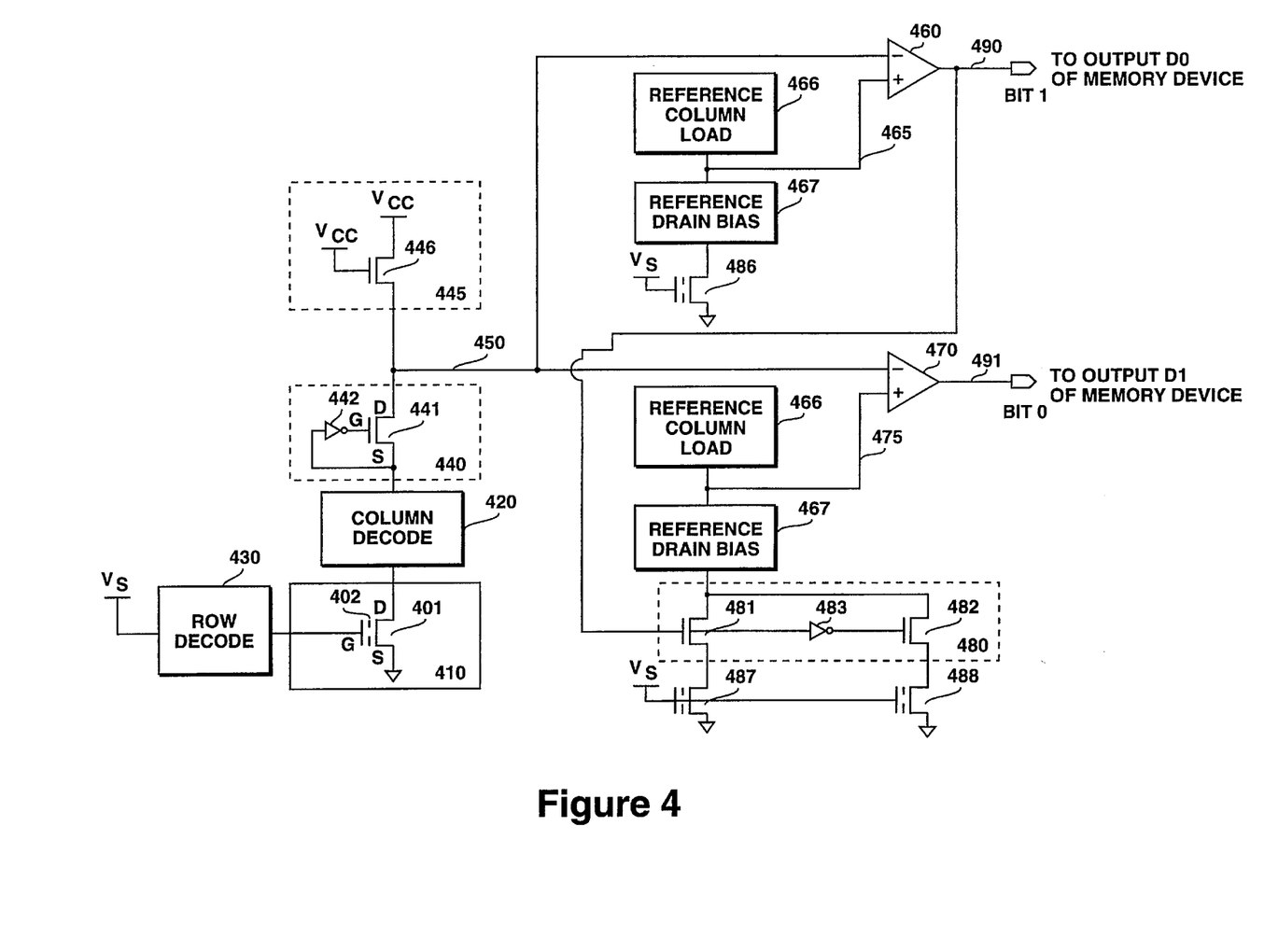
FIG. 4 illustrates a sensing circuit that uses two comparators for sensing the state of a flash cell having four possible states.

FIG. 4 shows a sensing circuit for determining the state of a memory cell having four possible states. This circuit implements the method of FIG. 3. The circuit uses a constant-gate-voltage/variable-cell-current sensing scheme wherein a constant biasing voltage $V_S$ is applied to the select gates of a selected flash cell 401 and reference flash cells 486, 487 and 488. The state of the selected flash cell 401, as a function of the level of charge on floating gate 402 of the flash cell 401, is determined by comparing the cell current of the selected flash cell 401 to the reference cell currents of a reference flash cell 486 and a selected one of the reference flash cells 487 and 488. To sense the respective cell currents, a load is coupled to the drains of the respective flash cells to give rise to a voltage drop. In this manner, the cell charge level of the selected flash cell is sensed and used to determine the analog state of the selected flash cell.

The multi-level flash cell 401 of the present embodiment includes a select gate, a floating gate 402, a drain and a source. The selected flash cell 401 is one of an array 410 of such multi-level flash cells arranged in a matrix of rows and columns. The selected flash cell 401 is selected when column decoder 420 and row decoder 430 select the selected flash cell 401 in response to a user-provided address. When the selected flash cell 401 is selected, a biasing voltage $V_S$ is applied to the select gate of flash cell 401 and the drain of flash cell 401 is coupled to the drain bias circuit 440 via column decoder 420. It will be understood that several flash cells of the array 410 can be concurrently selected in a similar manner such that multiple bits of data may be read simultaneously. Accordingly, each selected cell would be coupled to sensing circuitry similar to that shown in FIG. 4.

The cell charge level on the floating gate 402 of the selected flash cell 401 determines the amount of cell current that flows through selected flash cell 401 when the biasing voltage $V_S$ is applied to the select gate of selected flash cell 401 by defining the cell threshold voltage $V_t$. When the selected flash cell 401 is conducting current, a corresponding current is produced across the column load 445, resulting in a voltage drop from VCC to the node 450. The voltage at node 450 is sensed by the differential comparators 460 and 470 used to determine the state of the flash cell 401.

In FIG. 4, the column load 445 is shown as an n-channel FET 446 coupled as a resistor having its source coupled to node 450, its drain coupled to VCC and its gate coupled to a constant voltage $V_{CL}$. The constant voltage $V_{CL}$ can be such that the FET 446 operates in the saturated region. Alternatively, the column load may be a resistor. A drain bias circuit 440 is also coupled between the array 410 and node 450. The function of the drain bias circuit 440 is to isolate the column load 445 from the drain of the selected flash cell 401 while biasing the drain of the selected flash cell 401. The drain bias circuit includes an n-channel FET 441 having its drain coupled to node 450, its source coupled to the selected flash cell 401 via the column decode 420, and its gate coupled to the output of an inverter 442 which has an input coupled to the source of FET 441. Alternatively, the n-channel FET 441 may be coupled as a static gate cascode.

The voltage at node 450 is a function of the drain-source current of the selected flash cell 401. In turn, the cell current of the selected flash cell 401 is a function of the amount of charge on the floating gate 402. As $V_t$ increases, the cell current decreases. Similarly, the cell current increases as $V_t$ decreases. Thus, if the selected flash cell 401 is in state 1, the voltage at node 450 is less than if the selected flash cell 401 is in state 2.

In this circuit, comparators 460 and 470 determine the state of the selected flash cell 401 by comparing the voltage at node 450 to the voltages at reference nodes 465 and 475, respectively. In this embodiment, the voltage at reference node 465 is determined by a reference flash cell 486 that has a $V_t$ set to $V_{R2}$. Thus, the voltage at reference node 465 is greater than the voltage at node 450 if the selected flash cell 401 is programmed to state 1 or state 2. The voltage at node 465 is less than the voltage at node 450 if the selected flash cell 401 is programmed to state 3 or state 4. The reference flash cell 486 has its source coupled to ground, its gate coupled to the biasing voltage $V_S$, and its drain coupled to a reference drain bias circuit 467, which may be identical to the drain bias circuit 440. The drain bias circuit 467 is coupled to a reference column load circuit 466, which may be identical to column load 445. For the comparator 470, the voltage at reference node 475 is determined by a selected one of reference flash cells 487 and 488 having $V_t$s equal to $V_{R1}$ and $V_{R3}$, respectively. Reference node 475 is similarly coupled to a reference column load 466 and a reference drain bias 467.

There are a number of different ways for providing a reference voltage to sense the state of the selected flash cell. For example, one scheme is to provide two reference cells having different threshold voltages $V_t$ with their drains coupled together. Two identical column load circuits are coupled in parallel to the drains of the two reference cells at the reference node. Assuming that the same voltage is applied to the select gates of the reference cells, the voltage at the reference node is equivalent to a single reference cell having a cell current equal to the average of the cell currents of the two reference cells multiplied by the resistance of a single column load circuit. Also, the voltage reference may be generated using a single reference cell with its gate driven to one of (n−1) different values by a digital-to-analog converter. For a further discussion of one reference circuit, see U.S. Pat. No. 5,289,412, issued to Frary et al., and commonly assigned to Intel Corporation of Santa Clara, Calif.

Additionally, the current across the reference column load 466 may be produced by circuits other than reference flash cells. For example, a constant current source or current mirror may be used. The use of current mirror circuits in conjunction with an array of reference flash cells provides the needed reference currents for sensing multiple flash cells simultaneously without having to reproduce the array of reference flash cells for each output of the memory device.

The negative terminals of comparators 460 and 470 are both coupled to node 450 for sensing the voltage resulting from applying the biasing voltage $V_S$ to the select gate of the selected flash cell 401. Comparator 460 has its positive terminal coupled to reference node 465. The positive terminal of comparator 470 is coupled to reference node 475. The selection between the reference flash cells 487 and 488 is made in response to the output of comparator 460. A selector circuit 480 is coupled between the output signal line 490 of the comparator 460 and the first and second reference cells.

The selector circuit 480 includes a first n-channel FET 481 coupled between the drain bias circuit 467 and the reference flash cell 487, and a second n-channel FET 482 coupled between the drain bias circuit 467 and the reference flash cell 488. The signal line 490, which is the output of the comparator 460, is coupled to the gate of FET 481. An inverter 483 is coupled between the output signal line 490 and the gate of the second FET 482. If the output of the first comparator 460 is a logic 1, indicating that the selected flash cell 401 has a lower $V_t$ than the reference flash cell 486, the first FET 481 is switched on, and the second comparator 470 is coupled to the reference flash cell 487. If the output of the first comparator 460 is a logic 0, the inverter inverts the output to switch the FET 482 on, coupling the second comparator 470 to the reference flash cell 488. The second comparator 470 outputs the result of the second comparison via output signal line 491. For this embodiment, the output signal line 490 outputs Bit 1 and the output signal line 491 outputs Bit 0. In this manner, no decoding logic is necessary as the outputs of the comparators 460 and 470 correspond directly to the state of the selected flash cell 401.

The sensing circuit of this embodiment is especially useful when the number n of possible states is a power of two, i.e. when ($\log_2 n$) is an integer, because the circuit is configured to perform a binary search. When n is equal to 4 the threshold voltage $V_t$ of the first reference cell is within the separation range between the (n/2) state and the (n/2+1) state. If the threshold voltage $V_t$ of the first reference cell is greater than the threshold voltage $V_t$ of the selected flash cell, the threshold voltage $V_t$ of the second reference cell is within the separation range between the (n/4) state and the (n/4+1) state. If the threshold voltage $V_t$ of the first reference cell is less than the threshold voltage $V_t$ of the selected flash cell, the threshold voltage $V_t$ of the second reference cell is within the separation range between the (3n/4) state and the ((3n/4)+1)) state. For each additional bit stored per cell, a single comparator can be added and the selector circuit is modified.

Figure 5:
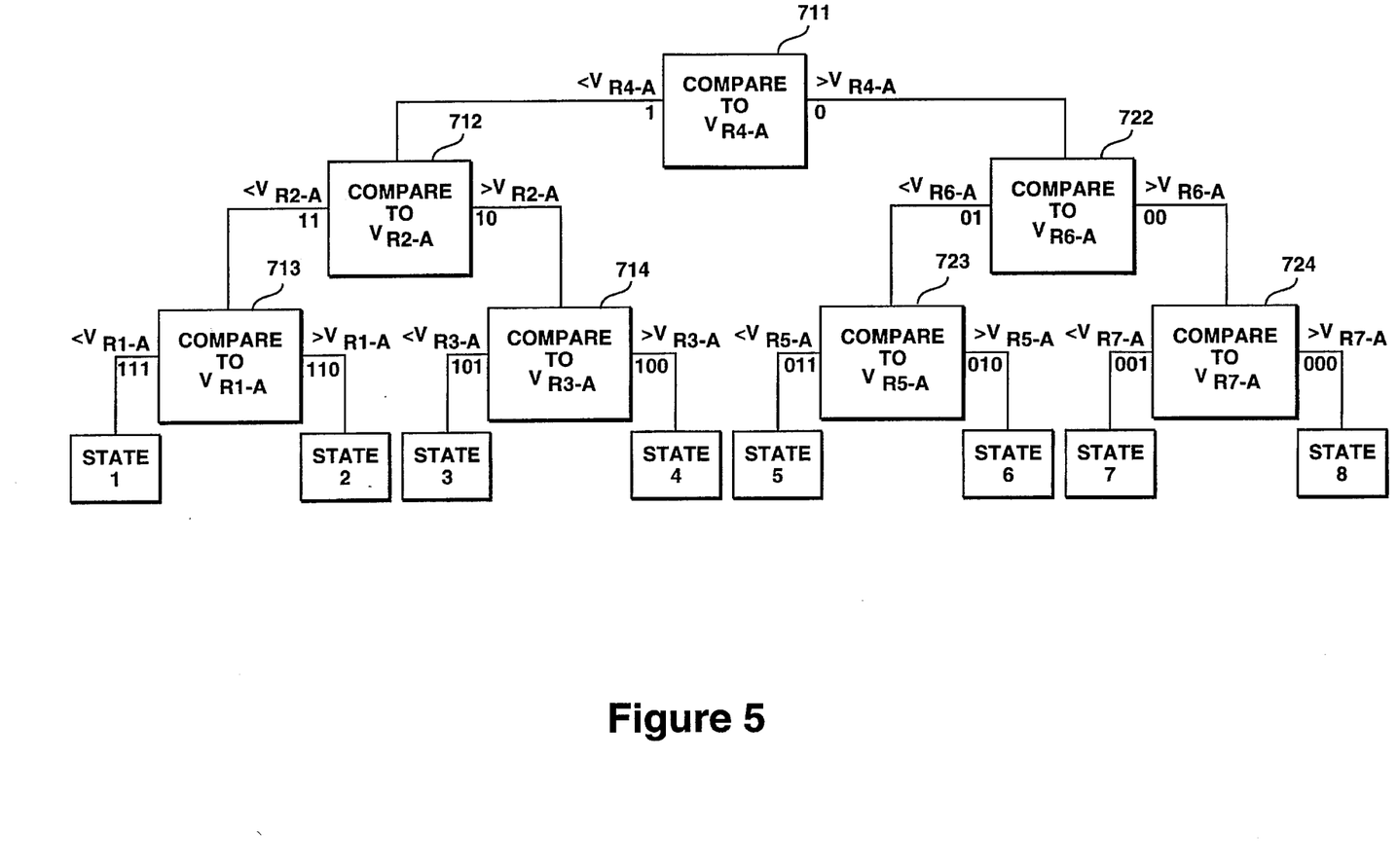
FIG. 5 illustrates a flow chart for performing a binary search using seven reference cells when reading a flash cell having eight possible states.
Figure 6:
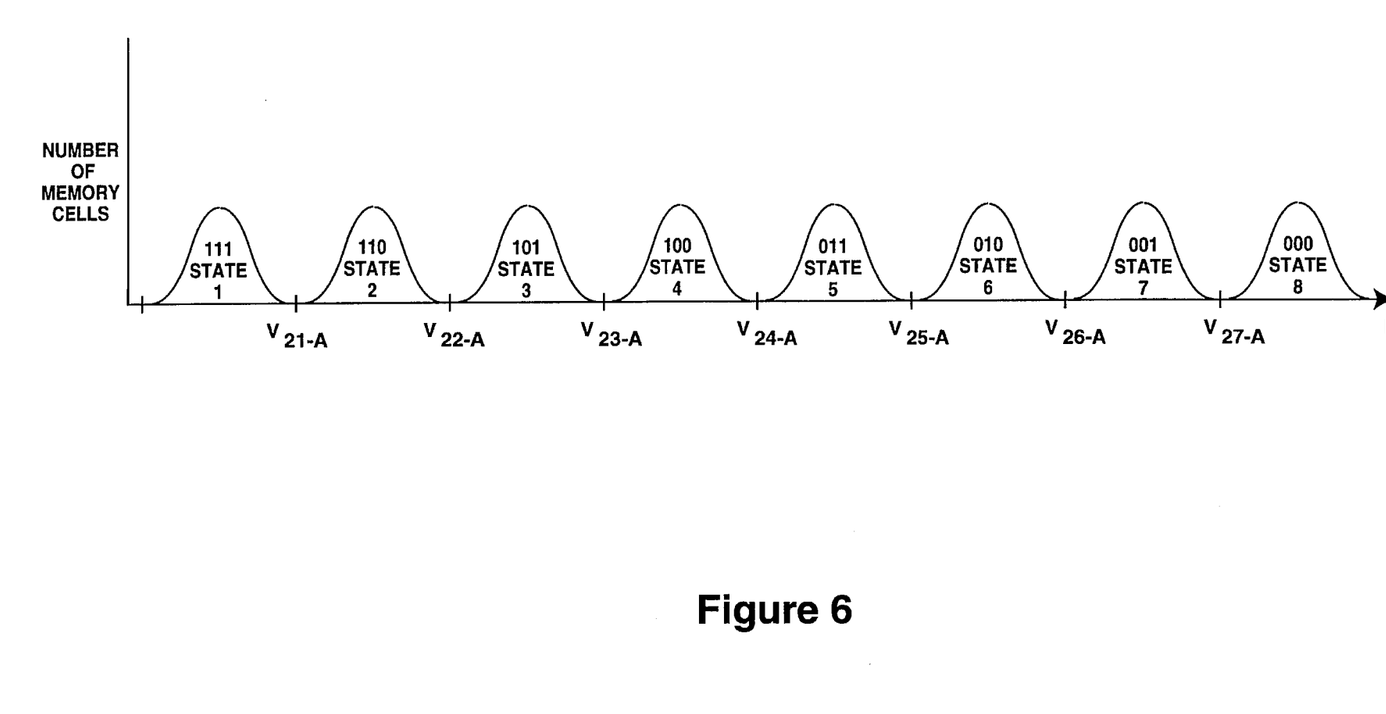
FIG. 6 illustrates a distribution of multi-level flash cells as a function of $V_T$ wherein each flash cell has eight possible states.

When n is equal to 8, 16, 32, etc., the selection of reference cells continues in a similar manner, the remaining states being bisected until the states of all bits stored in the flash cell are determined. FIG. 5 shows a flow chart for a binary search using seven reference cells when reading a flash cell having eight possible states. FIG. 6 is a distribution of flash cells versus $V_t$ for a flash device capable of having eight states. Returning to FIG. 5, the binary search of the eight reference cells begins at step 511 with the initial comparison of the cell charge level of the selected cell to the cell charge level of a first reference cell having a $V_t$ equal to $V_{R4-A}$. If the sensed cell charge level is less than that of the first reference cell, the search continues in steps 712, 713 and 714 as described in steps 312, 318 and 313 of FIG. 3. If the sensed cell charge level is greater than that of the first reference cell, the search continues as shown in steps 722, 723 and 724. Each state is represented by three binary bits.

Figure 7:
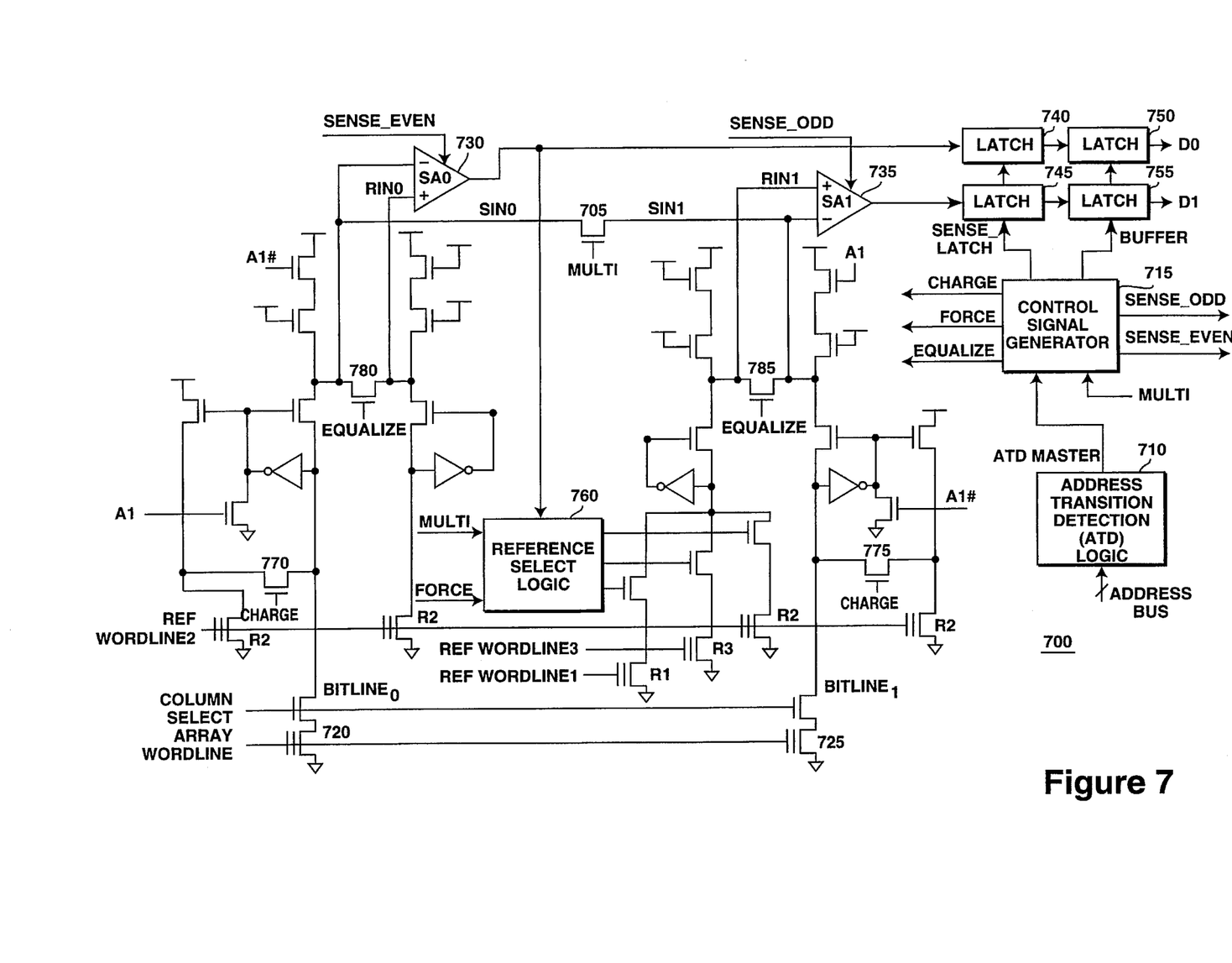
FIG. 7 illustrates a sensing circuit that uses address transition detection when sensing the state of a flash cell having four possible states.
Figure 8:
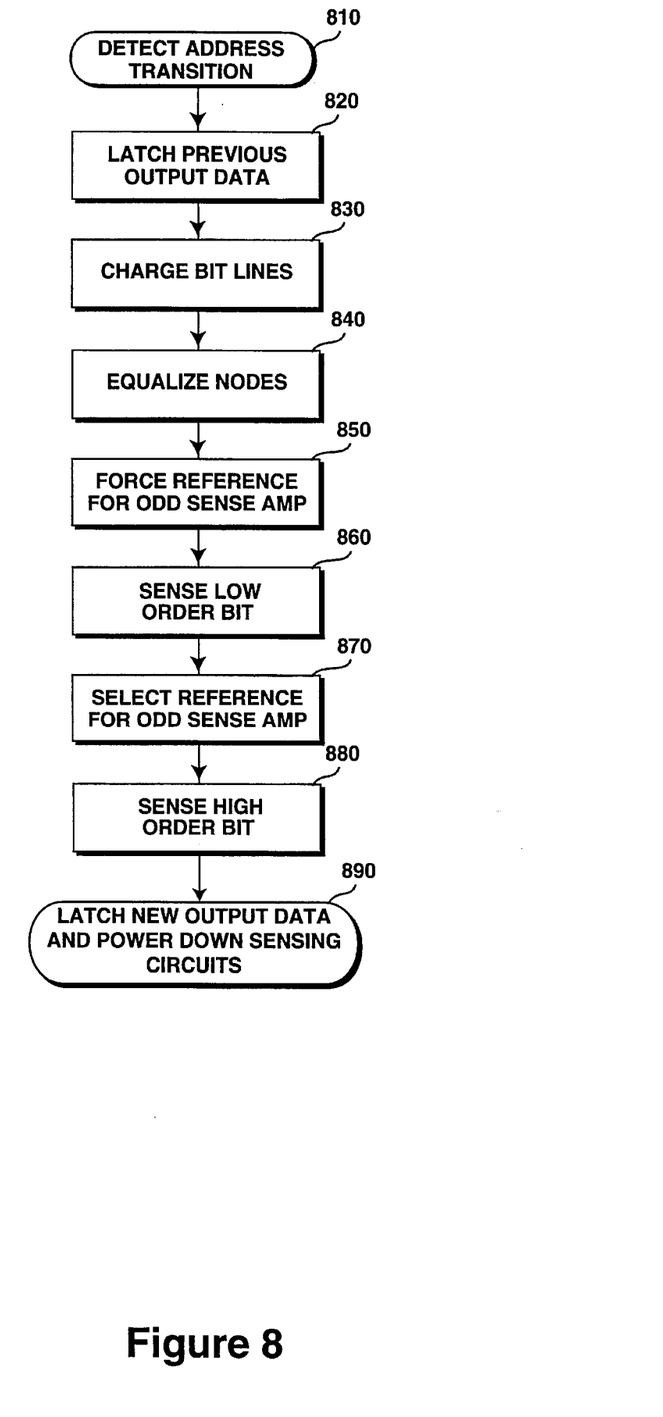
FIG. 8 illustrates a flow chart of the application within the circuit of FIG. 7 of address transition detection when sensing the state of a flash cell having four possible states.

FIG. 7 illustrates a sensing circuit 700 that uses address transition detection when sensing the state of a flash cell having four possible states. FIG. 8 illustrates a flow chart of the address transition detection interface within the circuit of FIG. 7 when sensing the state of a flash cell having four possible states. In FIG. 8, upon the detection of an address transition in start bubble 810, the previous output data is latched (process block 820). This permits the output from the previous read to be provided until the next data to be output has been sensed. The sensing of the new data begins in process block 830 with a charging of a bitline for the cell to be sensed. Next, as shown in process block 840, certain nodes (described further in connection with FIG. 9) within circuit 700 are equalized in order to prepare for reading. Then, as shown in process block 850, the reference voltage for the odd sense amp, (i.e., the sense amp that will sense the high order bit of the two bit data to be sensed), is forced to the middle reference R2. Next, in process block 860 the value of the low order bit of the two bit data to be sensed is determined by the even sense amp.

Based upon the low order bit value sensed in process block 860, the appropriate reference is selected to be provided to the odd sense amp in place of the middle reference R2 (process block 870) and the odd sense amp is used to sense the high order bit (process block 880). The selected reference is only provided in process block 870 after a predetermined period has elapsed following the determination of the low order bit value sensed in process block 860. By delaying provision of the selected reference for the predetermined period of time, the cell output voltage being sensed is permitted to stabilize thereby increasing reliability of the sensing process by ensuring that the proper reference voltage is selected. Otherwise, one must either wait a longer period before the cell sensing can be reliably sensed or risk selecting the incorrect reference voltage to use in the second comparison due to a voltage swing from the cell being sensed. Finally in process block 890, after the low and high order bits have been sensed, the new output data which has been sensed is latched and the sensing circuitry can be powered down until the next cell is to be sensed.

Referring again to circuit 700 of FIG. 7, address transition detection logic 710 receives as an input, a multi-bit address bus containing the addresses corresponding to cells which can be sensed. Circuitry for detecting address transitions are well known in the art. An example of an address transition detection circuit suitable for use in circuit 700 can be found in U.S. Pat. No. 5,243,575.

Upon detecting a transition in any one (or more) of the bit lines of the address bus, address transition detection logic 710 releases an ATD MASTER signal pulse to control signal generator 715. In turn, generator 715 generates signals used to control the ATD portion of the sensing operation. Thus, upon receiving the ATD MASTER pulse indicating that an address transition detection has occurred, control signal generator 715 generates signals BUFFER, SENSE_LATCH, SENSE_ODD, SENSE_EVEN, CHARGE, FORCE, and EQUALIZE.

Figure 9:
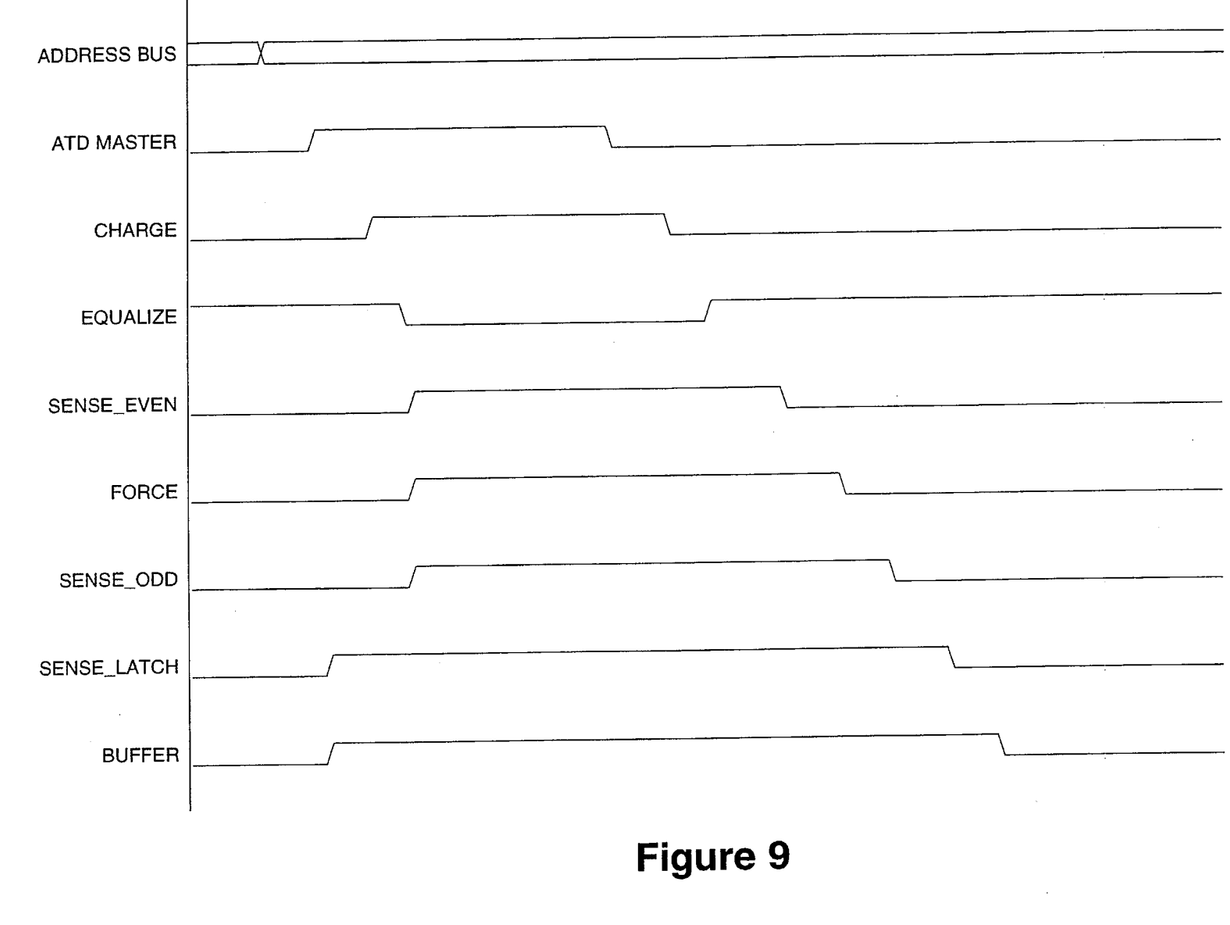
FIG. 9 illustrates the timing of address transition detection interface signals within the circuit of FIG. 7.

FIG. 9 illustrates the timing of these address transition detection interface signals within circuit 700 of FIG. 7. In FIG. 9, it can be seen that the ATD MASTER pulse is generated shortly after a transition of at least one address signal on the address bus. The ATD MASTER pulse then remains asserted for a predetermined minimum amount of time after the transition (or transitions) of the address signals on the address bus have stabilized. The ATD master pulse then ends after the address transitions have stopped for the predetermined time period.

Upon receipt of an ATD master pulse, control signal generator 715 causes signal SENSE_LATCH and BUFFER to be asserted. This permits the lower bit of any previously sensed data to flow from sense latch 740 to buffer latch 750 where it is held and provided as output D0 until the new data specified by the new address has been sensed. Similarly, the high order bit of the previously sensed data is permitted to flow through sense latch 745 to buffer latch 755 where it is held and provided as output D1 until the sensing of the new data has been completed.

Once the previously sensed data has been latched in buffer latches 750 and 755, control signal generator 715 asserts signal CHARGE to closes gates 770 and 775 and thereby provide a kicker pulse to cause the precharging of bitline zero or bitline one depending upon address signal A1. Shortly thereafter, control signal generator 715 deasserts signal EQUALIZE to causes gates 780 and 785 to close, thereby shorting the inputs to sense amps SA0 730 and SA1 735, respectively, and forcing their output to logical 1. Thus, when gate 780 is closed, SIN 0 the signal sensed on bitline zero is set equal to reference RIN (which in this case is reference R2). Similarly, when gate 785 is closed, the inputs to sense amp SA1 735 (i.e., SIN 1 and RIN 1) are shorted together.

After equalization of the SIN and RIN nodes has begun, control signal generator 715 asserts signals SENSE_EVEN and SENSE_ODD, to equalize sense amps SA0 730, and SA1 735, respectively. At the same time, control signal generator 715 asserts signal FORCE and provides it to reference select logic 760 to thereby force reference select logic 760 to provide reference R2 as input RIN 1 to sense amp SA1 735.

After the new address on the address bus has stabilized, address transition detection logic 710 causes the ATD master pulse to be deasserted. Then, as soon as the bitlines have been pre-charged, control signal generator 715 can deassert the CHARGE signal and halt equalization of the SIN and RIN nodes by deasserting the EQUALIZE signal. After pre-charging and node equalization have completed, signal SENSE_EVEN is deasserted by generator 715 to permit sense amp SA0 730 to sense the low order bit value of SIN 0 coming from cell 720. The low order bit sensed by sense amp SA0 730 is then provided to sense latch 740 and to reference select logic 760. Signal FORCE from control signal generator 715 forces reference select logic 760 to continue to select reference R2 for a period of time sufficient to permit the output from sense amp SA0 730 to stabilize. Then, signal FORCE is deasserted and, based upon the output of sense amp SA0 730, reference select logic 760 selects either reference R1 or R3 to be provided as the reference input RIN 1 to sense amp SA1 735.

Because a multi-level sensing is being performed, signal MULTI is asserted causing pass gate 705 to close and provide the input SIN 0 from bitline zero as the value SIN 1 to sense amp SA1 735. Control signal generator 715 then deasserts the SENSE_ODD signal permitting sense amp SA1 735 to provide the high order bit as output to sense latch 745.

After the output from sense amp SA1 735 is available, signals SENSE_LATCH and BUFFER are deasserted thereby causing the new data that has just been sensed to be provided as D0 (for the low order bit) and D1 (for the high order bit).

Note that the circuit 700 of FIG. 7 is symmetric. Thus, based upon the value of address signal A1, the multi-level cell to be sensed is either cell A0 720 or A1 725. Also note, that when the multi-bit signal MULTI is not asserted, pass gate 705 is open and reference select logic 760 is disabled. This permits a conventional binary sensing to be performed. In such a case, the data of cell 720 is sensed by sense amp SA0 730 and latched in sense latch 740 and buffer latch 750 before being provided as output D0. Similarly, cell 725 is sensed by sense amp SA1 735 before being latched by latch 745 and buffer latch 755 and then output as data D1. In the binary cell mode the R2 reference signal is provided as RIN 0 to sense amp SA0 730 and as RIN 1 to SA1 735. Signal MULTI is also provided to control signal generator 715 so that signal SENSE_ODD will be deasserted when signal SENSE_EVEN is deasserted when in the binary cell mode. Thus, the address transition detection benefits still are available in the binary cell mode.

Also note that, although sensing for only two cells is shown in circuit 700 of FIG. 7, the circuit can be extended so that a greater number of cells are sensed. Thus, in an embodiment where two bits per cell are stored, a 16-bit data word can be read by providing eight pairs of cells and then sensing one cell of each pair to provide the 16-bit data word. Similarly, the sense system of FIG. 7 can be extended for multi-level cell cases where more than four levels per cell can be stored. Thus, in the case where eight levels can be stored, three sense amps would be provided (one sense amp per bit).

Figure 10:
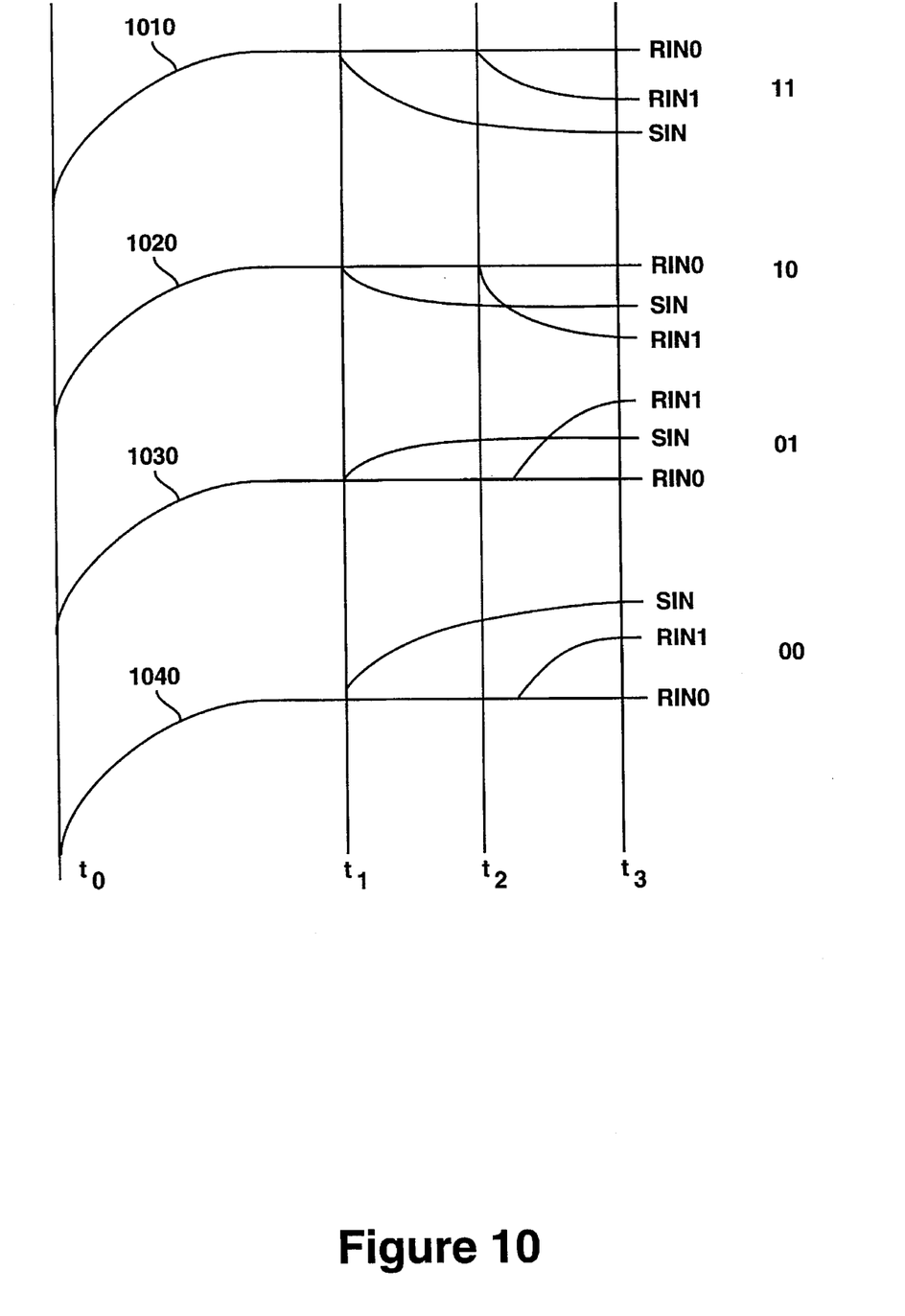
FIG. 10 illustrates the sensing of data within the circuit of FIG. 7 for each of the four possible states.

Referring now to FIG. 10, the sensing of data within the circuit of FIG. 7 for each of the four possible states is shown. Curve 1010 shows the sensing of a base two value 11 stored within a cell. At time T0, nodes SIN, RIN 1 and RIN 0 are equalized and begin charging to the middle reference value R2. At time T1, signal SENSE_EVEN is deasserted and sense input signal SIN is allowed to drop to the value stored within the cell being sensed. Thus, at time T2, signal SIN has fallen sufficiently to reliably detect that the lower bit of the data being sensed is a logical 1, therefore the FORCE signal is deasserted and reference RIN 1 for sense amp SA1 is allowed to drop to reference voltage R1. Finally, at time T3, signal SENSE_ODD is deasserted thereby permitting sense amp SA1 to compare SIN to RIN 1 and reliably detect that the value being sensed has a base two value of 11. Similarly, in curves 1020, 1030 and 1040, input as RIN 1 to sense amp SA1 is forced to middle reference R2 from time T1 to T2. This permits any voltage swings in signal SIN to end before the appropriate reference R1 or R3 is selected to be provided to sense amp SA1 730. Thus, the high order bit stored within the multi-level cell being sensed can be quickly and reliably determined.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. Sensing circuitry for determining a state of a memory cell, the sensing circuitry comprising:

a first sense amp for comparing a cell charge level of a first memory cell to a first reference and outputting a first result;

reference selection circuitry for selecting between second and third references in response to the first result;

a second sense amp for comparing the cell charge level of the first memory cell to the selected one of the second and third references and outputting a second result; and first forcing circuitry for providing the first reference in place of the selected one of the second and third references to the second sense amp for a predetermined period of time following output of the first result.

2. The sensing circuitry as set forth in claim 1, further comprising:

latching circuitry for latching a previous first and second result prior to comparing the cell charge level of the first memory cell to the first reference.

3. The sensing circuitry as set forth in claim 1, further comprising:

precharging circuitry for precharging a bit line associated with the first memory cell prior to comparing the cell charge level of the first memory cell to the first reference.

4. The sensing circuitry as set forth in claim 1, further comprising:

node equalization circuitry for equalizing selected nodes of the sensing circuitry prior to the first sense amp comparing the cell charge level of the first memory cell to the first reference.

5. The sensing circuitry as set forth in claim 1, further comprising:

second forcing circuitry for forcing the first reference to be input to the first sense amp prior to the first sense amp comparing the cell charge level of the first memory cell to the first reference.

6. The sensing circuitry as set forth in claim 1, further comprising:

latching circuitry for latching the first and second results prior to powering down sensing circuits used to determine the state of the first memory cell.

7. The sensing circuitry as set forth in claim 1, further comprising:

address transition detection circuitry for detecting an address transition prior to the first sense amp comparing the cell charge level of the first memory cell to the first reference.

8. The sensing circuitry as set forth in claim 1, further comprising:
   multi-bit mode detection circuitry for detecting a mode of operation for the first memory cell; and
   binary cell selection circuitry for causing the second sense amp to compare a cell charge level of a second memory cell to the first reference to provide the second result while the first sense amp is comparing the cell charge level of the first memory cell to the first reference to provide the first result, if the first memory cell is in a binary cell mode.

9. A method for determining a state of a memory cell, the method comprising the steps of:
   comparing a cell charge level of a first memory cell to a first reference and outputting a first result;
   selecting between second and third references in response to the first result;
   providing the first reference in place of the selected one of the second and third references for a predetermined period of time following output of the first result; and
   comparing the cell charge level of the first memory cell to the selected one of the second and third references and outputting a second result.

10. The method as set forth in claim 9, further comprising the step of:
    latching a previous first and second result prior to comparing the cell charge level of the first memory cell to the first reference.

11. The method as set forth in claim 9, further comprising the step of:
    precharging a bit line associated with the first memory cell prior to comparing the cell charge level of the first memory cell to the first reference.

12. The method as set forth in claim 9, further comprising the step of:
    equalizing selected nodes prior to comparing the cell charge level of the first memory cell to the first reference.

13. The method as set forth in claim 9, further comprising the step of:
    providing the first reference prior to comparing the cell charge level of the first memory cell to the first reference.

14. The method as set forth in claim 9, further comprising the step of:
    latching the first and second results prior to powering down sensing circuits that were used to determine the state of the first memory cell.

15. The method as set forth in claim 9, further comprising the step of:
    detecting an address transition prior to comparing the cell charge level of the first memory cell to the first reference.

16. The method as set forth in claim 9, further comprising the steps of:
    determining a mode of operation for the first memory cell;
    comparing the cell charge level of the first memory cell to the first reference and outputting the first result while comparing a cell charge level of a second memory cell to the first reference to provide the second result, if the first memory cell is in a binary cell mode.

17. Sensing circuitry for determining a state of a memory cell, the sensing circuitry comprising:
    a first sense amp to compare a cell charge level of a first memory cell to a first reference and output a first result;
    reference selection circuitry coupled to the first sense amp, the reference selection circuitry to select between second and third references in response to the first result;
    a second sense amp, coupled to the reference selection circuitry, the second sense amp to compare the cell charge level of the first memory cell to the selected one of the second and third references and output a second result; and
    first forcing circuitry coupled to the second sense amp and to the reference selection circuitry, the first forcing circuitry to provide the first reference in place of the selected one of the second and third references to the second sense amp for a predetermined period of time following output of the first result.

18. The sensing circuitry as set forth in claim 17, further comprising:
    latching circuitry coupled to the first and second sense amps, the latching circuitry to latch a previous first and second result prior to the first sense amp comparing the cell charge level of the first memory cell to the first reference.

19. The sensing circuitry as set forth in claim 17, further comprising:
    precharging circuitry coupled to the first sense amp, the precharging circuitry to precharge a bit line associated with the first memory cell prior to the first sense amp comparing the cell charge level of the first memory cell to the first reference.

20. The sensing circuitry as set forth in claim 17, further comprising:
    node equalization circuitry coupled to the first and second sense amps, the node equalization circuitry to equalize selected nodes of the sensing circuitry prior to the first sense amp comparing the cell charge level of the first memory cell to the first reference.

21. The sensing circuitry as set forth in claim 17, further comprising:
    second forcing circuitry coupled to the first sense amp, the second forcing circuitry to force the first reference to be input to the first sense amp prior to the first sense amp comparing the cell charge level of the first memory cell to the first reference.

22. The sensing circuitry as set forth in claim 17, further comprising:
    latching circuitry coupled to the first and second sense amps, the latching circuitry to latch the first and second results prior to powering down sensing circuits used to determine the state of the first memory cell.

23. The sensing circuitry as set forth in claim 17, further comprising:
    address transition detection circuitry coupled to the first sense amp, the address transition detection circuitry to detect an address transition prior to the first sense amp comparing the cell charge level of the first memory cell to the first reference.

24. The sensing circuitry as set forth in claim 17, further comprising:
    multi-bit mode detection circuitry to detect a mode of operation for the first memory cell; and
    binary cell selection circuitry coupled to the multi-bit mode detection circuitry and to the first and second sense amps, the binary cell selection circuitry to cause the second sense amp to compare a cell charge level of a second memory cell to the first reference to provide the second result while the first sense amp is comparing the cell charge level of the first memory cell to the first reference and outputting the first result, if the first memory cell is in a binary cell mode.

25. A computer system, comprising:

a processor; and a memory device coupled to the processor, the memory device having a memory cell array and sensing circuitry for determining a state of a memory cell of the array upon request from the processor, the sensing circuitry including:

a first sense amp for comparing a cell charge level of a first memory cell to a first reference and outputting a first result;

reference selection circuitry for selecting between second and third references in response to the first result;

a second sense amp for comparing the cell charge level of the first memory cell to the selected one of the second and third references and outputting a second result; and first forcing circuitry for providing the first reference in place of the selected one of the second and third references to the second sense amp for a predetermined period of time following output of the first result.

26. The computer system as set forth in claim 25, further comprising:

latching circuitry for latching a previous first and second result prior to comparing the cell charge level of the first memory cell to the first reference.

27. The computer system as set forth in claim 25, further comprising:

precharging circuitry for precharging a bit line associated with the first memory cell prior to comparing the cell charge level of the first memory cell to the first reference.

28. The computer system as set forth in claim 25, further comprising:

node equalization circuitry for equalizing selected nodes of the sensing circuitry prior to the first sense amp comparing the cell charge level of the first memory cell to the first reference.

29. The computer system as set forth in claim 25, further comprising:

second forcing circuitry for forcing the first reference to be input to the first sense amp prior to the first sense amp comparing the cell charge level of the first memory cell to the first reference.

30. The computer system as set forth in claim 25, further comprising:

latching circuitry for latching the first and second results prior to powering down sensing circuits used to determine the state of the first memory cell.

31. The computer system as set forth in claim 25, further comprising:

address transition detection circuitry for detecting an address transition prior to the first sense amp comparing the cell charge level of the first memory cell to the first reference.

32. The computer system as set forth in claim 25, further comprising:

multi-bit mode detection circuitry for detecting a mode of operation of the first memory cell; and binary cell selection circuitry for causing the second sense amp to compare a cell charge level of a second memory cell to the first reference to provide the second result while the first sense amp is comparing the cell charge level of the first memory cell to the first reference to provide the first result, if the first memory cell is in a binary cell mode.

* * * * *